United States Patent
Lim et al.

(10) Patent No.: US 10,541,292 B2
(45) Date of Patent: Jan. 21, 2020

(54) ELECTROLUMINESCENCE DISPLAY APPARATUS

(71) Applicant: LG DISPLAY CO., LTD., Seoul (KR)

(72) Inventors: ByungJun Lim, Ansan-si (KR); YoungSun Jang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 120 days.

(21) Appl. No.: 15/599,529

(22) Filed: May 19, 2017

(65) Prior Publication Data

US 2018/0182283 A1 Jun. 28, 2018

(30) Foreign Application Priority Data

Dec. 27, 2016 (KR) .................. 10-2016-0180338

(51) Int. Cl.
*G09G 3/3233* (2016.01)
*H01L 27/32* (2006.01)

(52) U.S. Cl.
CPC ...... *H01L 27/3262* (2013.01); *H01L 27/3211* (2013.01); *G09G 2300/0842* (2013.01); *G09G 2320/0204* (2013.01)

(58) Field of Classification Search
CPC ....... G09G 2320/043; G09G 2320/045; G09G 2320/0295
See application file for complete search history.

(56) References Cited

U.S. PATENT DOCUMENTS

| | | | | |
|---|---|---|---|---|
| 8,558,825 B2* | 10/2013 | Bae | ...... | G09G 3/3233 |
| | | | | 315/169.3 |
| 8,692,746 B2* | 4/2014 | Ebisuno | ...... | G09G 3/3233 |
| | | | | 345/77 |
| 8,963,816 B2* | 2/2015 | Baik | ...... | G09G 3/3233 |
| | | | | 345/78 |
| 9,165,496 B1* | 10/2015 | Jung | ...... | G09G 3/3225 |
| 9,236,011 B2* | 1/2016 | Mizukoshi | ...... | G09G 3/3291 |
| 9,330,605 B2* | 5/2016 | Park | ...... | G09G 3/3233 |
| 9,858,866 B2* | 1/2018 | Kim | ...... | G09G 3/3233 |
| 9,898,962 B2* | 2/2018 | Yang | ...... | G09G 3/3233 |
| 10,096,281 B2* | 10/2018 | An | ...... | G09G 3/3233 |

(Continued)

FOREIGN PATENT DOCUMENTS

KR 10-2015-0002286 A 1/2015
KR 10-2015-0071366 A 6/2015

*Primary Examiner* — William Boddie
*Assistant Examiner* — Bipin Gyawali
(74) *Attorney, Agent, or Firm* — Birch, Stewart, Kolasch & Birch, LLP

(57) ABSTRACT

An electroluminescence display device according to an embodiment includes a plurality of sub-pixels. Each of the plurality of sub-pixels includes a Node-A electrically connected to an electrode of a storage capacitor and a gate electrode of a P-type driving transistor, an N-type switching transistor configured to switch an electrical connection between a Node-B electrically connected to a data line and the Node-A, a Node-C configured to supply ELVDD voltage and electrically connected to another electrode of the storage capacitor and a first electrode of the P-type driving transistor, a Node-D configured to supply current to an electroluminescence diode and electrically connected to a second electrode of the P-type driving transistor, and a first transistor configured to switch an electrical connection between the Node-A and the Node-D.

17 Claims, 8 Drawing Sheets

(56) References Cited

U.S. PATENT DOCUMENTS

| | | | |
|---|---|---|---|
| 2003/0122745 A1 | 7/2003 | Miyazawa | |
| 2004/0066358 A1* | 4/2004 | Numao | G09G 3/2011 345/76 |
| 2007/0195020 A1* | 8/2007 | Nathan | G09G 3/3233 345/76 |
| 2008/0042948 A1* | 2/2008 | Yamashita | G09G 3/3233 345/82 |
| 2008/0074413 A1* | 3/2008 | Ogura | G09G 3/3233 345/212 |
| 2008/0231562 A1* | 9/2008 | Kwon | G09G 3/3233 345/77 |
| 2008/0297449 A1* | 12/2008 | Yamashita | G09G 3/3233 345/76 |
| 2009/0248344 A1* | 10/2009 | Hirabayashi | G09G 3/3648 702/85 |
| 2009/0315813 A1* | 12/2009 | Uchino | G09G 3/3233 345/76 |
| 2010/0045646 A1* | 2/2010 | Kishi | G09G 3/3233 345/211 |
| 2010/0073357 A1* | 3/2010 | Min | G09G 3/3233 345/214 |
| 2011/0063283 A1* | 3/2011 | Ryu | G09G 3/3283 345/214 |
| 2011/0122119 A1* | 5/2011 | Bae | G09G 3/3233 345/211 |
| 2011/0157134 A1* | 6/2011 | Ogura | G09G 3/20 345/211 |
| 2011/0227505 A1* | 9/2011 | Park | H05B 33/0896 315/297 |
| 2011/0273419 A1 | 11/2011 | Park et al. | |
| 2013/0083087 A1* | 4/2013 | Byun | G09G 3/3233 345/690 |
| 2013/0141316 A1* | 6/2013 | Lee | G09G 3/3266 345/76 |
| 2013/0147690 A1* | 6/2013 | Kim | G09G 3/3233 345/76 |
| 2014/0091997 A1* | 4/2014 | Han | G09G 3/3677 345/92 |
| 2014/0168190 A1* | 6/2014 | Kwak | G09G 3/3233 345/212 |
| 2014/0368415 A1* | 12/2014 | Kim | G09G 3/3233 345/77 |
| 2015/0001504 A1* | 1/2015 | Kim | H01L 27/32 257/40 |
| 2015/0084946 A1* | 3/2015 | Shim | G09G 3/3258 345/212 |
| 2015/0170565 A1* | 6/2015 | Hong | G09G 3/3233 345/212 |
| 2015/0170571 A1* | 6/2015 | Park | G09G 3/3258 345/690 |
| 2015/0213757 A1* | 7/2015 | Takahama | G09G 3/3266 345/691 |
| 2015/0294626 A1* | 10/2015 | Bi | G09G 3/3233 345/211 |
| 2016/0055791 A1* | 2/2016 | Kishi | G09G 3/3241 345/212 |
| 2016/0104419 A1* | 4/2016 | Chung | G09G 3/3225 345/78 |
| 2016/0111042 A1* | 4/2016 | Pyeon | G09G 3/3208 345/212 |
| 2016/0111044 A1* | 4/2016 | Kishi | G09G 3/3233 345/690 |
| 2016/0125787 A1* | 5/2016 | Pyeon | G09G 3/2022 345/691 |
| 2016/0203764 A1* | 7/2016 | In | G09G 3/3225 345/215 |
| 2016/0307498 A1* | 10/2016 | Chaji | G09G 3/3291 |
| 2017/0025061 A1* | 1/2017 | Takizawa | G09G 3/3233 |
| 2017/0032738 A1* | 2/2017 | Lee | G09G 3/3233 |
| 2017/0039953 A1* | 2/2017 | Lee | G09G 3/3233 |
| 2017/0045972 A1* | 2/2017 | Xu | G06F 3/0416 |
| 2017/0053590 A1* | 2/2017 | Song | G01R 19/1659 |
| 2017/0061877 A1* | 3/2017 | Lee | G09G 3/3233 |
| 2017/0061892 A1* | 3/2017 | Jung | G09G 3/3291 |
| 2017/0169767 A1* | 6/2017 | Song | G09G 3/3241 |
| 2018/0151129 A1* | 5/2018 | Park | G09G 3/3233 |
| 2018/0182287 A1* | 6/2018 | Park | G09G 3/3233 |
| 2018/0240403 A1* | 8/2018 | Wang | G09G 3/006 |

* cited by examiner

ELECTROLUMINESCENCE DISPLAY APPARATUS

CROSS REFERENCE TO RELATED APPLICATIONS

This application claims the priority benefit of the Korean Patent Application No. 10-2016-0180338 filed on Dec. 27, 2016, which is hereby incorporated by reference as if fully set forth herein.

BACKGROUND

Technical Field

The present disclosure relates to an electroluminescence display device, and more particularly, to an electroluminescence display device capable of compensating a threshold voltage.

Related Technology

An electroluminescence display device is a self-luminous display device, unlike a liquid crystal display device, which does not require a separate light source, and can be manufactured in a thin and lightweight form. In addition, the electroluminescence display device has advantages such as fast response time, wide viewing angle, and infinite contrast ratio as well as low power consumption according to a low voltage driving scheme.

An active area AA of an electroluminescence display device includes a plurality of sub-pixels. The sub-pixel includes an electroluminescence diode ELD. A periphery area PA is formed around the pixel area AA.

An electroluminescence diode includes an anode, an emission layer, and a cathode. The high-potential voltage ELVDD is supplied to the anode (i.e., the pixel electrode) through the driving transistor. The low-potential voltage ELVSS is supplied to the cathode (i.e., the common electrode).

Between the anode and the cathode of the electroluminescence diode, various organic layers and/or inorganic layers may be further included. For example, a hole injection layer (HIL), a hole transport layer (HTL), an electron transport layer (ETL), and/or an electron injection layer (EIL) may be included. When a potential difference is generated between the anode electrode and the cathode electrode, the holes passing through the hole transport layer and the electrons passing through the electron transport layer result excitons at the light emitting layer. As a result, the emission layer emits visible light wavelengths (e.g., from 380 nm to 680 nm).

The emission layer of the electroluminescence diode may comprise an organic material and/or an inorganic material. When the emission layer is made of an organic material, it may be referred to as an organic light emitting diode (OLED). When it is made of an inorganic material, it may be referred to as an inorganic light emitting diode (ILED). The inorganic material may be, for example, a quantum-dot and/or a Nano-crystal material. The structure of the emission layer may be a mixture of the inorganic emission material and the organic emission material or a stacked structure of the inorganic emission material and the organic emission material.

The sub-pixel adjusts its brightness by adjusting the amount of current supplied to the electroluminescence diode. According to the level of the data voltage, the sub-pixel adjusts the amount of current supplied to the electroluminescence diode. The sub-pixel controls the electroluminescence diode using at least two switching transistors, at least one driving transistor, and at least one storage capacitor.

A scan driver and/or a data driver is electrically connected in a periphery area of the pixel area AA to drive a plurality of sub-pixels.

The scan driver sequentially turns on or turns off the transistors TFTs of the plurality of sub-pixels. Therefore, the scan driver drives the sub-pixels.

The scan driver includes a shift register comprising a plurality of stages which are dependently connected to each other. The scan driver receives a start pulse or a carry signal received from a previous stage as a start pulse, thereby generating an output when a clock is input, and the scan signal can be sequentially supplied to the scan lines by shifting the output according to the shift clock timing.

The data driver supplies the data voltage to the sub-pixel. The supplied data voltage is charged in the storage capacitor of the sub-pixel.

The brightness of the electroluminescence diode is adjusted according to the charged data voltage, thereby an image is displayed.

The brightness of the electroluminescence display device is displayed according to the gradation of the digital video signal. The brightness according to the gradation of an electroluminescence display device is adjusted between a minimum brightness (e.g., minimum 0 nit) and a maximum brightness (e.g., maximum 1000 nit). The gradation of the electroluminescence display device varies depending on the format of the video signal. For example, a video signal of 8-bit format can display 256 gradation levels, and a video signal of 10-bit format can display 1024 gradation levels.

SUMMARY OF THE INVENTION

The inventors of the present disclosure have studied and developed an electroluminescence display device with a high quality display image.

Specifically, the inventors of the present disclosure have attempted to realize a sub-pixel having excellent performance by arranging various kinds of transistors. For example, an electroluminescence display device having excellent performance is realized by taking advantage of an N-type transistor having minimum leakage current characteristics and a P-type transistor having excellent current driving characteristics.

However, the sub-pixel structure including both the N-type transistor and the P-type transistor is more difficult to manufacture, and it is relatively difficult to ensure the uniformity of the driving transistor. Particularly, when the sub-pixel includes both the N-type transistor and the P-type transistor in the mass production of the electroluminescence display device, it is difficult to improve the lifetime of the transistors and the uniformity of the threshold voltage deviation $\Delta Vth$ of the transistors. Therefore, the inventors of the present disclosure have recognized the difficulty of mass production.

Particularly, since each of the N-type transistor and the P-type transistor has a different manufacturing process and has different semiconductor characteristics, there is a technical difficulty in uniformly securing the characteristics of each transistor.

Accordingly, an object of the present disclosure is to provide an electroluminescence display device capable of compensating various deviations of sub-pixels including both an N-type transistor and a P-type transistor.

It should be noted that objects of the present disclosure are not limited to the above-described objects and other objects of the present disclosure will be apparent to those skilled in the art from the following descriptions.

To solve the limitations of the related art and/or to achieve the above described objects, there is provided an electroluminescence display device comprising a plurality of sub-pixels, each of the plurality of sub-pixels including a Node-A electrically connected to an electrode of a storage capacitor and a gate electrode of a P-type driving transistor, an N-type switching transistor configured to switch an electrical connection between a Node-B electrically connected to a data line and the Node-A, a Node-C configured to supply an ELVDD voltage and electrically connected to another electrode of the storage capacitor and a first electrode of the P-type driving transistor, a Node-D configured to supply current to an electroluminescence diode and electrically connected to a second electrode of the P-type driving transistor and a first transistor configured to switch an electrical connection between the Node-A and the Node-D, wherein each of the plurality of sub-pixels is configured to compensated a first threshold voltage deviation of the P-type driving transistor and a second threshold voltage deviation of the N-type switching transistor based on a voltage at the Node-A.

The details of other embodiments are included in the detailed description and accompanying drawings.

According to the embodiments of the present disclosure, it is possible to compensate the threshold voltage deviation (ΔVth) of the driving transistor and to compensate the threshold voltage deviation (ΔVth) of the switching transistor.

According to the embodiments of the present disclosure, the compensation information is stored. Therefore the threshold voltage can be compensated by the stored information, and consequently, a high-speed driving can be performed while displaying an image.

It should be noted that the effects of the present disclosure are not limited to those described above and other effects of the present disclosure are included in the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PRESENT DISCLOSURE

Figure 1:
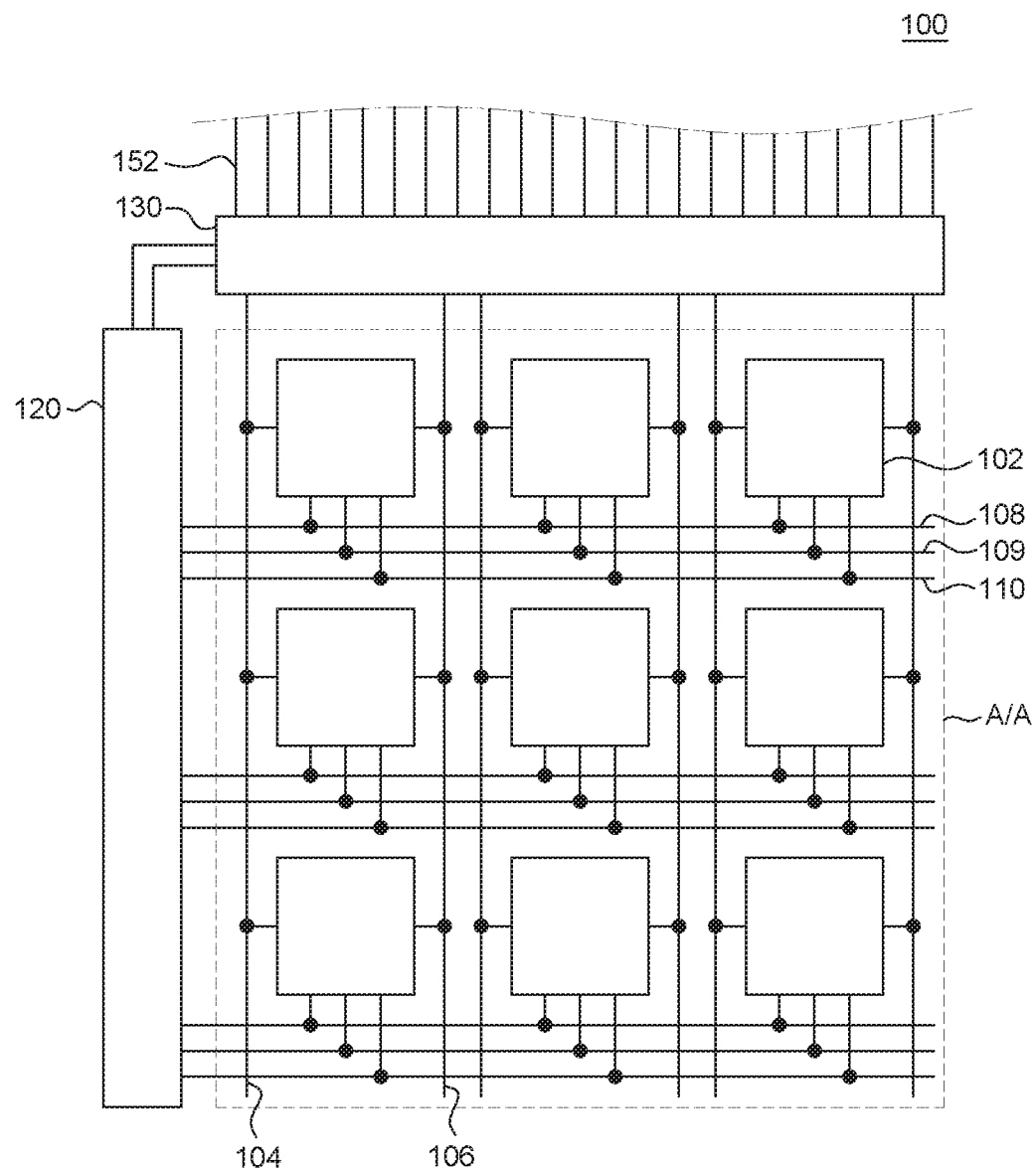
FIG. 1 is a conceptual diagram schematically illustrating an electroluminescence display device according to an embodiment of the present disclosure.

Advantages and features of the present disclosure and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention and the present invention will be defined by the appended claims.

The shapes, sizes, ratios, angles, numbers and the like illustrated in the accompanying drawings for describing the exemplary embodiments of the present disclosure are merely examples and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including", "having", "comprising" and "consist of" used herein are generally intended to allow other components to be added unless the terms are used with the term "only". Any references to singular may include plural unless expressly stated otherwise.

Components are interpreted to include an ordinary error range or an ordinary tolerance range even if not expressly stated.

When the position relation between two parts is described using the terms such as "on", "above", "below" and "next", on or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second" and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art and the embodiments can be carried out independently of or in association with each other.

Various exemplary embodiments of the present disclosure will be described in detail with reference to the accompanying drawings.

FIG. 1 is a conceptual diagram schematically illustrating an electroluminescence display device 100 according to an embodiment of the present disclosure. All the components of the electroluminescence display device according to all embodiments of the present disclosure are operatively coupled and configured.

The electroluminescence display device 100 according to an embodiment of the present disclosure may be realized of one type among a top-emission type electroluminescence display device that emits to an upper side, a bottom-emission type electroluminescence display device that emits to a lower side, and a dual-emission type electroluminescence display device that emits to the upper and the lower side. The electroluminescence display device 100 may be implemented as a transparent display device and/or a flexible display device. But the present disclosure is not limited thereto.

Referring to FIG. 1, the electroluminescence display device 100 according to an embodiment of the present disclosure will be described.

The electroluminescence display device 100 is formed on a substrate. The substrate may be made of glass, plastic, metal coated with an insulating film, ceramics, or the like, and supports various components of the electroluminescence display device. The substrate may be curved, or it may be bent. Also, when the substrate is bent, a portion of the peripheral area PA may overlap with the pixel area AA. However, the present disclosure is not limited to the type of substrate or the definition of a specific area.

On the substrate, a pixel area AA and a peripheral area PA of the pixel area AA are configured.

The pixel area AA includes a plurality of sub-pixels 102 and displays an image. The peripheral area PA refers to a peripheral area around the pixel area AA.

The sub-pixel 102 is electrically connected to at least one data line 104, an ELVDD line 106, a first scan line 108, a second scan line 109, and an EM line 110. The sub-pixel 102 is driven according to a signal and a voltage applied through the respective lines.

The sub-pixel 102 is electrically connected to various lines and is driven by receiving various signals. In general, one pixel may include three or four sub-pixels, and a plurality of pixels are arranged as an array or a matrix in a pixel area. Here, the number, shape, arrangement and the like of the sub-pixels constituting one pixel may vary and may be suitably implemented according to the size, usage, characteristics and the like of the electroluminescence display device. Each sub-pixel 102 adjusts the luminance of the sub-pixel by adjusting the amount of current supplied to the electroluminescence diode.

The emission layer of the electroluminescence diode may include an organic material and/or an inorganic material. When the emission layer is made of an organic material, it may be referred to as an organic light emitting diode (OLED), and when it is made of an inorganic material, it may be referred to as an inorganic light emitting diode (ILED). The inorganic material may be, for example, a quantum-dot and/or Nano-crystal material. The emission layer may be a structure in which the inorganic emission material and the organic emission material are mixed or stacked. But the present disclosure is not limited thereto.

Each sub-pixel 102 may include an electroluminescence diode or may be electrically connected to an electroluminescence diode. The electroluminescence diode includes an anode, an emission layer, and a cathode. The high-potential voltage ELVDD may be supplied to the anode through the driving transistor. The low-potential ELVSS may be supplied to the cathode (i.e., common electrode). The cathode may be formed to cover the pixel area AA. But the present disclosure is not limited thereto.

In some embodiments, the pixel area AA may be configured with various shapes such as a circle, an ellipse, a rectangle, a square, a triangle and the like.

In some embodiments, it is possible that at least one transistor may be made of an oxide semiconductor layer.

In some embodiments, it is possible that at least one transistor may be made of a low temperature poly silicon (LTPS) semiconductor layer.

In some embodiments, it is also possible that at least one transistor may be made of an oxide semiconductor layer and a low-temperature polysilicon semiconductor layer.

In the peripheral area PA, circuits configured to drive the pixel area AA are arranged. For example, the peripheral area PA includes a scan driver 120 and a driving unit 130. The above-described circuits and the sub-pixels may be electrically connected to each other by the above-described lines.

The driving unit 130 may receive a video signal (e.g., an image signal) from a system. The driving unit 130 may convert a digital video signal into a data voltage (i.e., an analog video signal). The driving unit 130 may include a gamma voltage generator for generating a data voltage or may be electrically connected to a separate gamma voltage generator.

In other words, the gamma voltage may be referred to as a voltage corresponding to respective gray levels of a video signal. The gamma voltage generator may convert a digital video signal to an analog voltage using a digital to analogue converter (DAC). But the present disclosure is not limited thereto.

For example, the driving unit 130 may perform a function of controlling the timing of respective signals for supplying the data voltages corresponding to the respective sub-pixels 102.

The driving unit 130 may be referred to as a circuit unit that performs a function of a data driver, a function of a timing controller, or a function of both a data driver and a timing controller. But the present disclosure is not limited thereto.

The driving unit 130 may receive various reference voltages generated by a reference voltage supply unit. The reference voltage supply unit may be a voltage generating circuit such as a DC-DC converter or the like and it may generate an ELVDD voltage, an ELVSS voltage, a reference voltage, and various signals required for driving internal logics of the driving unit 130, such as high voltage, low voltage and various clock (CLK) signals.

In some embodiments, the reference voltage supply unit may be configured as a part of the driving unit 130 or as a part of the system.

The scan driver 120 of the electroluminescent display device 100 according to an exemplary embodiment of the present disclosure includes a plurality of shift registers. The shift registers sequentially transfer pulses to scan lines and EM lines.

For example, the pixel area AA may include a plurality of sub-pixels 102 arranged in a matrix (N-rows×M-columns).

Preferably, N and M are positive integers. The scan driver 120 may include N-shift registers. That is, one shift register supplies the scan signal SCAN and the EM signal EM to one row of the pixel area AA. But the present disclosure is not limited thereto. The scan driver 120 may sequentially output the scan signals.

For example, the scan driver 120, may include a first scan line 108 electrically connected to the gate electrode of the first transistor 260, a second scan line 109 electrically connected to the gate electrode of the second transistor 262, so as to supply the first scan signal Scan1 to the first scan line 108 and the second scan signal Scan2 to the second scan line 109. The scan driver 120 may further include a fourth transistor 266 and may be electrically connected to the EM line 110 electrically connected to the gate electrode of the fourth transistor 266 to apply an EM signal to the EM line 110. Although the fourth transistor 266 and the EM line 110 are illustrated merely for convenience of explanation, but the fourth transistor 266 and the EM line 110 of the present disclosure are not limited thereto.

The PAD line 152 of the electroluminescence display device 100 may electrically connect the driving unit 130 and the system according to an embodiment of the present disclosure. The driving unit 130 may receive various control signals and various reference voltages from the system through the PAD line 152. For example, the driving unit 130 may receive a video signal transmitted from the system and display an image. The video signal may be a digital format signal (e.g., 6-bit, 8-bit and 10-bit). But the present disclosure is not limited thereto.

The PAD line 152 may be electrically connected to the substrate through a pad formed on the substrate. For example, when the PAD line 152 is mounted, an anisotropic conductive film (ACF) or the like may be used as the conductive adhesive. The PAD line 152 may be a printed circuit board or a flexible circuit board. But the present disclosure is not limited thereto.

In some embodiments, the driving unit 130 may be formed or mounted on the PAD line 152.

In some embodiments, the electroluminescence display device may comprise a system. In such case, the electroluminescence display device and the system are integrated, and the integrated electroluminescence display device can independently supply the video signal.

Figure 2:
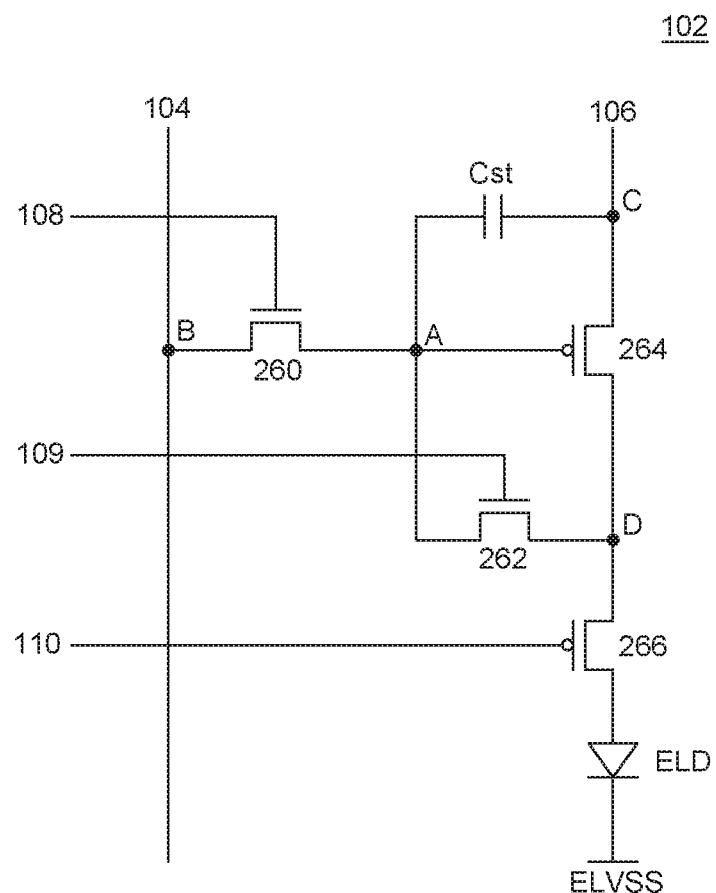
FIG. 2 is a circuit diagram schematically illustrating a sub-pixel of the electroluminescence display device according to an embodiment of the present disclosure.

FIG. 2 is a circuit diagram schematically illustrating a sub-pixel of the electroluminescence display device according to an embodiment of the present disclosure.

Referring to FIG. 2, the sub-pixel 102 is configured to include a first transistor 260, a second transistor 262, a third transistor 264, a fourth transistor 266, an electroluminescent diode ELD, and a storage capacitor Cst.

The sub-pixel 102 is configured to include at least one P-type transistor and at least one N-type transistor.

In the case of an N-type transistor, since the carrier is an electron, the source voltage has a lower voltage than the drain voltage so that electrons can flow from the source electrode to the drain electrode. That is, the direction of the current in the N-type transistor flows from the drain electrode toward the source electrode.

In the case of the P-type transistor, since the carrier is a hole, the source voltage has a higher voltage than the drain voltage so that holes can flow from the source electrode to the drain electrode. That is, the direction of the current in the P-type transistor flows from the source electrode toward the drain electrode.

However, the characteristics of the source electrode and the drain electrode of the transistor are not invariable, and the definitions of the source electrode and the drain electrode can be determined according to the applied voltage. Therefore, the present disclosure is not limited to the positions of the source electrode and the drain electrode of the transistor. In other words, the transistor described in the present disclosure may mean a three-electrode element including a gate electrode, a source electrode, and a drain electrode. The channel is located between the source electrode and the drain electrode and overlapped with the gate electrode. The source electrode may be an electrode for supplying a carrier to the transistor. The drain electrode may be an electrode from which the carrier exits from the transistor. That is, in the transistor, the carrier moves from the source electrode to the drain electrode through the channel.

In addition, in the case of the switching transistor, since it performs the function of turn on/off the channel of the transistor, it should be noted that the position of the source and drain electrodes should not be considered as a limitation. Thus, the source electrode and the drain electrode will be referred to as a first electrode or a second electrode for convenience of explanation. It is also possible to explain that, when the channel is turned on, the channel of the switching transistor becomes conductive.

The first transistor 260 is formed of an N-type transistor (NMOS). The first transistor 260 is configured to perform the function of a switching transistor. The gate electrode of the first transistor 260 is electrically connected to the first scan line 108. One of the first electrode and the second electrode of the first transistor 260 is electrically connected to the Node-A and the other electrode is electrically connected to the Node-B. The data line 104 is electrically connected to the Node-B. Accordingly, when a turn-on voltage is applied to the first scan line 108, the first transistor 260 is turned on to electrically connect the Node-A and the Node-B. When the first transistor 260 is formed of an N-type transistor (NMOS) having a good leakage current cut off characteristic, it is advantageous that the voltage charged in the Node-A can be maintained for a long time. More preferably, when the first transistor 260 is made of a transistor including an N-type oxide semiconductor layer, there is an advantage that the voltage charged in the Node-A can be maintained more effectively.

The second transistor 262 may be a P-type transistor or an N-type transistor. The second transistor 262 is configured to perform a diode connection function of the third transistor 264, which is a driving transistor. The gate electrode of the second transistor 262 is electrically connected to the second scan line 109. One of the first and second electrodes of the second transistor 262 is electrically connected to the Node-A and the other electrode is electrically connected to the Node-D. When the second transistor 262 is formed of an N-type transistor (NMOS) having a good leakage current cut off characteristic, the voltage charged in the Node-A can be maintained for a long time. More preferably, when the second transistor 262 is made of a transistor including an N-type oxide semiconductor layer, there is an advantage that the voltage charged in the Node-A can be maintained more effectively. But the present disclosure is not limited thereto.

Accordingly, when the turn-on voltage is applied to the second transistor 262, the third transistor 264 is in the diode connection state.

The third transistor 264 is formed of a P-type transistor (PMOS). The third transistor 264 is configured to perform the function of a driving transistor. A gate electrode of the third transistor 264 is electrically connected to the Node-A, a source electrode thereof is electrically connected to the Node-C, and a drain electrode thereof is electrically connected to the Node-D. The ELVDD line 106 is electrically connected to the Node-C. When the third transistor 263 is formed of a P-type transistor (PMOS) having a good current driving characteristic, there is an advantage that the performance of the driving transistor can be improved. More preferably, when the third transistor 263 is formed of a transistor including the P-type low-temperature polysilicon semiconductor layer (LTPS), the area of the semiconductor layer of the third transistor 264 can be reduced, the driving efficiency can be increased and the power consumption can be improved. But the present disclosure is not limited thereto.

The fourth transistor 266 may be a P-type transistor or an N-type transistor. The fourth transistor 266 is configured to perform a function of blocking a current supplied to the electroluminescence diode ELD. The gate electrode of the fourth transistor 266 is electrically connected to the EM line 110. One of the first electrode and the second electrode of the fourth transistor 264 is electrically connected to the Node-D and the other electrode is electrically connected to the electroluminescence diode ELD.

The storage capacitor Cst includes at least two electrodes and is electrically connected to the Node-A and the Node-C. That is, the first electrode of the storage capacitor Cst is electrically connected to the Node-A and the second electrode is electrically connected to the Node-C. Accordingly, the storage capacitor Cst is configured to store the potential difference between the Node-A and the Node-C connected to the third transistor 264.

The cathode of the electroluminescence diode ELD is configured to receive the ELVSS voltage. The ELVSS voltage may be set lower than the ELVDD voltage.

For example, an electroluminescence display device 100 according to an embodiment of the present disclosure includes a Node-A electrically connected to one electrode of a storage capacitor Cst and a gate electrode of a third transistor 264, a first transistor 260 configured to switch the an electrical connection between a Node-B electrically connected to the data line 104 and the Node-A, a Node-C electrically connected to the other electrode of the storage capacitor and the first electrode of the third transistor 264 so as to supply an ELVDD voltage, a Node-D electrically connected to the second electrode of the third transistor 264 so as to supply a current to the electroluminescence diode ELD, and a second transistor 262 configured to switch the electrical connection of the Node-A and the Node-D. Further, the electroluminescence display device 100 according to an embodiment of the present disclosure may include a plurality of sub-pixels 102 configured to compensate the threshold voltage deviation ΔVth of the third transistor 264 based on the voltage of the Node-A and compensate the threshold voltage deviation ΔVth of the first transistor 260 based on the voltage of the Node-A. Here, the fourth transistor 266 may be selectively further included.

For example, the electroluminescence display device 100 further includes a fourth transistor 266 configured to switch the electrical connection between the electroluminescence diode ELD and the Node-D and an EM line 110, electrically connected to the gate electrode of the fourth transistor 266, configured to transfer the EM signal EM from the scan driver 120, wherein the fourth transistor 266 may function to cut off the leakage current generated from the Node-D to the electroluminescence diode ELD, when the driving unit 130 senses the threshold voltage of the third transistor 264 and the threshold voltage of the first transistor 260.

If the fourth transistor 266 is not in present, the voltage charged in the Node-A can be leaked to the electroluminescent diode ELD, so the charged voltage can be reduced slowly. Thus, the threshold voltage sensing accuracy can be reduced. But the present disclosure is not limited thereto.

Figure 3:
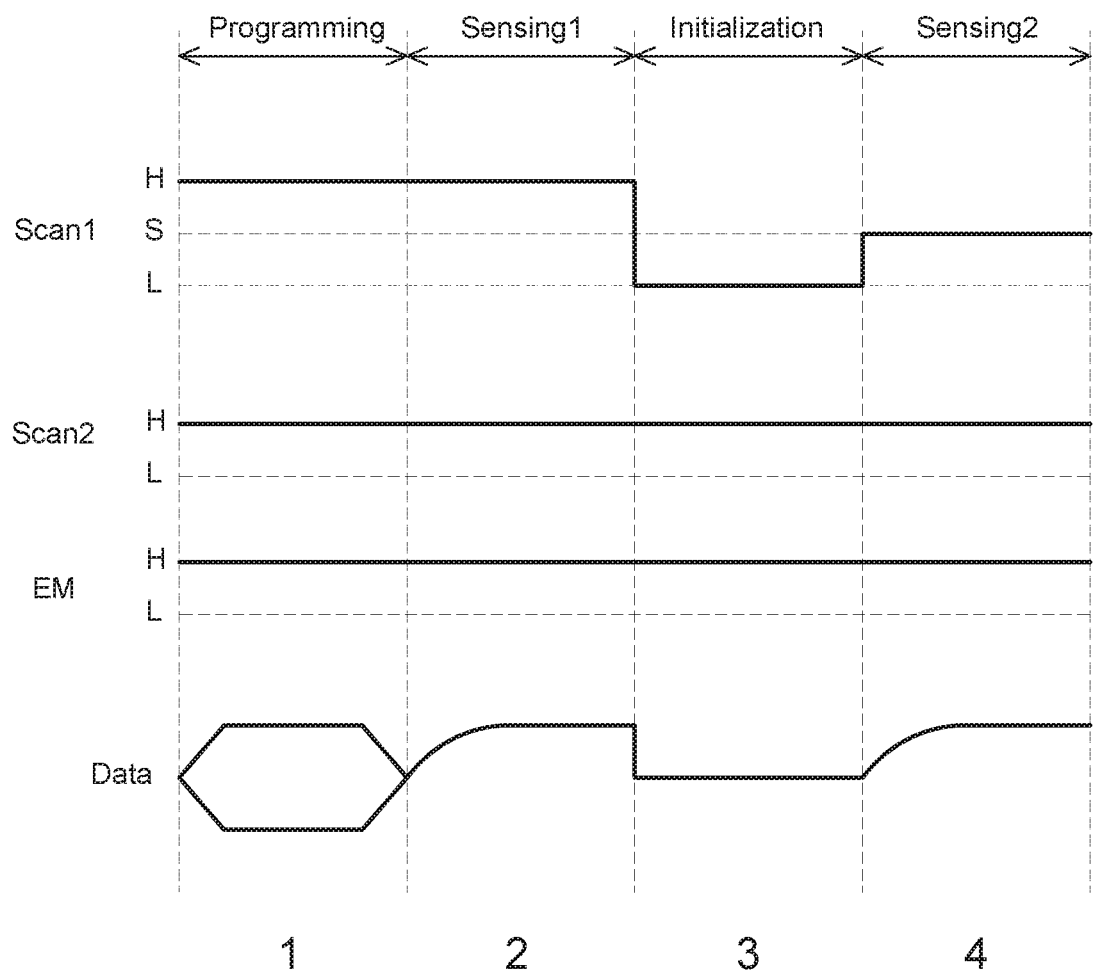
FIG. 3 is a waveform schematically illustrating the operation of the electroluminescence display device according to an embodiment of the present disclosure.

FIG. 3 is a waveform schematically illustrating the operation of the electroluminescence display device according to an embodiment of the present disclosure.

Referring to FIG. 3, the electroluminescence display device 100 is configured to operate in at least four steps.

Figure 4:
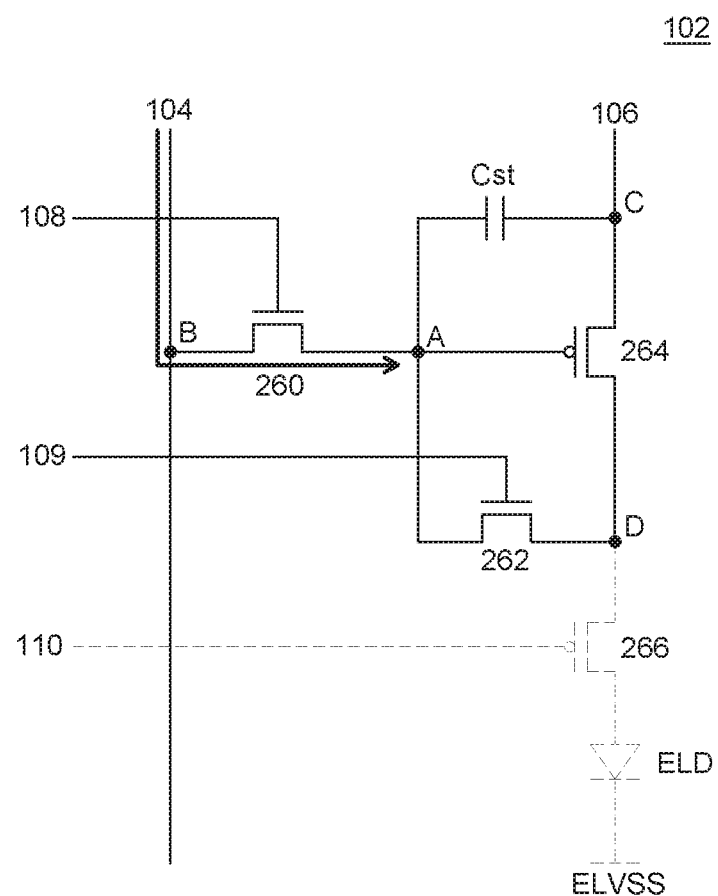
FIG. 4 is a circuit diagram illustrating the first step of the operation of the electroluminescence display device according to an embodiment of the present disclosure.

FIG. 4 is a circuit diagram illustrating the first step of the operation of the electroluminescence display device according to an embodiment of the present disclosure.

Referring to FIGS. 3 and 4, a programming step Programming of the first stage will be described below.

In the first programming step Programming, the first scan signal Scan1 of the turn-on voltage H is supplied through the first scan line 108 to turn-on the first transistor 260, the second scan signal Scan2 of the turn-on voltage H is supplied through the second scan line 109 to turn-on the second transistor 262 and the EM signal EM of the turn-off voltage is supplied through the EM line 110 to turn-off the fourth transistor 266. Accordingly, the potential of the Node-D can be set equal to that of the Node-A by the third transistor 264. However, in the first step, the second scan signal Scan2 is not limited to the turn-on voltage H, and it is also possible to set to be the turn-off voltage L.

In other words, since the turn-off voltage varies depending on the NMOS or PMOS, it can be varied depending on the characteristics of the transistor. As illustrated above, since the first transistor 260 and the second transistor 262 are NMOS, a high voltage performs a function of a turn-on voltage. Since the fourth transistor 266 is a PMOS transistor, the high voltage functions as a turn-off voltage. Therefore, in embodiments of the present disclosure, it should be noted that the turn-on voltage and the turn-off voltage may be changed according to the characteristics of the transistor.

If the fourth transistor 266 is turned on, the second transistor 262 is turned on. Accordingly, current can flow to the electroluminescence diode ELD. Therefore, the first voltage αV of the Node-A can be varied. Accordingly, it may be preferable to turn-off the fourth transistor 266 in the first step.

The driving unit 130 sets the first voltage αV of the Node-A through the data line 104. The voltage of the Node-A is set based on the voltage of the Node-C and the threshold voltage of the third transistor 263. Specifically, assuming that the first voltage of the Node-A is αV, the voltage of the Node-C is βV, and the threshold voltage of the third transistor 263 is Vth, then the voltage of the Node-A satisfies an equation that αV (βV+Vth).

For example, when βV is 10V and Vth is −2V, the first voltage αV of the Node-A should be a voltage smaller than 8V. If the first voltage αV of the Node-A is greater than 8V, the driving unit 130 may misinterpret when the threshold voltage of the third transistor 263 is sensed.

That is, the first voltage αV satisfying the condition αV (βV+Vth) is set in the Node-A through the data line 104 in the programming step of the first step. The driving unit 130 generates a predetermined first voltage αV and supplies the first voltage αV to the data line 104. For example, the first voltage αV may be a voltage value previously stored in the driving unit 130 or a predetermined reference voltage value. But the present disclosure is not limited thereto.

However, in order to set the first voltage αV, a pre-analysis step may be required. In other words, it may be useful to know a typical threshold voltage deviation range of the third transistor 264 in advance. More specifically, with respect to the deviation characteristics, distribution characteristics, and the like of the third transistor 264, the acquired information while developing a series of products can be used. Otherwise, by a simulation, the range of the threshold voltage deviation of the third transistor 264 may be estimated.

In other words, millions of sub-pixels 102 may be arranged in the pixel area AA, and the threshold voltages Vth of the sub-pixels 102 may be distributed within a certain range. That is, the first voltage αV satisfying the condition αV (βV+Vth) can be set to the Node-A of the respective sub-pixels 102 in the pixel area AA through statistical information, simulation, and/or experimentation. Then the determined first voltage αV may be stored in the driving unit 130. The minimum and the maximum voltage of the threshold voltage may be statistically estimated according to the threshold voltage distribution characteristics described above, however, there may be a limit that the threshold voltage of each subpixel 102 cannot be calculated. The threshold voltage distribution characteristics may be, for example, a Gaussian distribution. But the present disclosure is not limited thereto.

In other words, the first voltage αV supplied from the driving unit 130 is set based on the distribution characteristics of the threshold voltage ΔVth of the third transistors 264 in the pixel area AA.

According to the above-described configuration, the third transistor 264 is in the diode-connected state, and the threshold voltage of the third transistor 264 can be sensed by the first voltage αV set at the Node-A State.

If the specific sub-pixel 102 does not satisfy the above condition, it may fail to compensate the threshold voltage deviation ΔVth of the third transistor 264 of the corresponding sub-pixel 102, thereby a defective sub-pixel in the pixel area AA may be generated.

Figure 5:
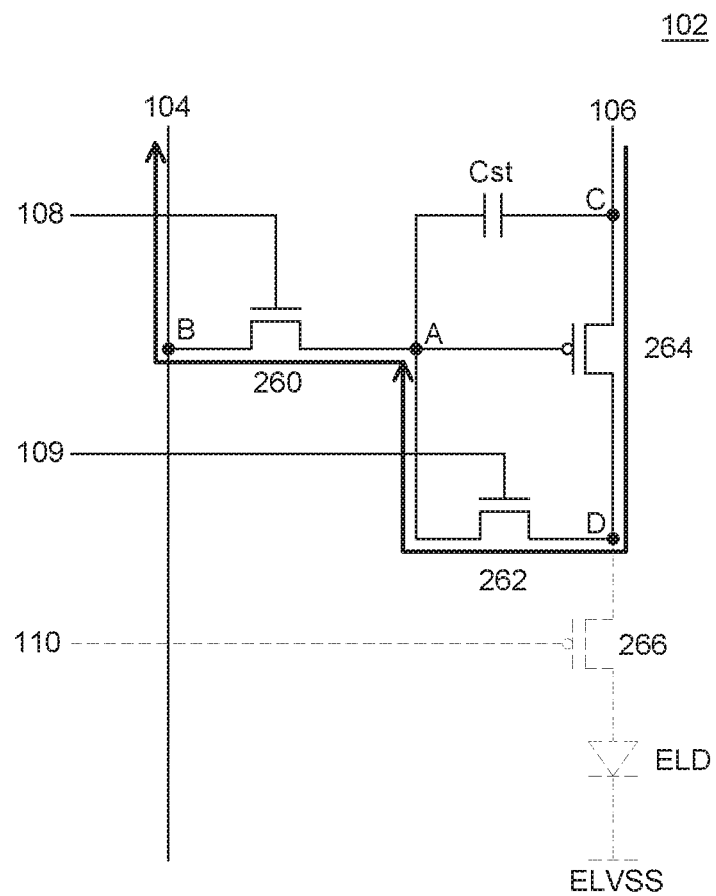
FIG. 5 is a circuit diagram illustrating the second step of the operation of the electroluminescence display device according to an embodiment of the present disclosure.

FIG. 5 is a circuit diagram illustrating the second step of the operation of the electroluminescence display device according to an embodiment of the present disclosure.

Hereinafter, the first sensing step Sensing1 which is the second step will be described with reference to FIGS. 3 and 5.

In the first sensing step, which is the second step, the first transistor 260 and the second transistor 262 are turned on and the fourth transistor 266 is turned off.

The driving unit 130 may interrupt the supply of the first voltage αV through the data line 104 and senses the second voltage α'V of the Node-A through the data line 104 again. In this case, the driving unit 130 may include an analogue to digital converter (ADC) electrically connected to the data line 104 to sense the threshold voltage of the third transistor 264. The analog-to-digital converter of the driving unit 130 is configured to convert the voltage of the Node-A into a digital value. The driving unit 130 is configured to switch for supplying a video signal to the data line 104 as needed and to switch to the analog-to-digital converter for sensing the voltage of the data line 104 as needed. That is, the driving unit 130 is configured to select so as to supply the video signal to the data line 104 or to sense the voltage of the data line 104.

According to the diode connection, the first voltage αV of the predetermined Node-A is changed to the second voltage α'V, thereby the threshold voltage of the third transistor 264 can be sensed. The second voltage α'V of the Node-A changes from a preset first voltage αV by the difference between the voltage βV of the Node-C and the threshold voltage of the third transistor 264. That is, the second voltage of the Node-A is charged until satisfying the condition α'V=(βV+Vth).

As the driving unit 130 stores the value of βV (i.e., ELVDD voltage), the driving unit 130 can sense α'V and analyze the threshold voltage of the third transistor 264. Then the driving unit 130 stores the analyzed threshold voltages Vth of the third transistor 264 of each sub-pixel 102 in a memory. The memory may be included in the driving unit 130 or in a system electrically connected to the driving unit 130. But the present disclosure is not limited thereto.

The driving unit 130 may further analyze the threshold voltage deviation ΔVth of each third transistor 264. The threshold voltage deviation ΔVth of each analyzed third transistor 264 may be stored in memory or utilized in real time. At this time, the driving unit 130 may store address of each of the sub-pixels 102. For example, when n×m sub-pixels are arranged in the pixel area AA, the threshold voltage of the third transistor 264 corresponding to the address of each sub-pixel 102 may be stored.

Therefore, the driving unit 130 can set an offset to a data voltage applied to each sub-pixel 102 by a threshold voltage deviation ΔVth of each third transistor 264. The driving unit 130 may calculate an average threshold voltage value (e.g., mean Vth) in order to calculate the threshold voltage deviation ΔVth. However, the present disclosure is not limited thereto, and the driving unit 130 may use various values such as the minimum threshold voltage value and the maximum threshold voltage value. The threshold voltage deviation ΔVth can be calculated by a voltage difference between the reference threshold voltage and the threshold voltage or a voltage difference between the standard threshold voltage and the threshold voltage.

In some embodiments, the driving unit 130 may compensate for the video signal with a look-up table technique by storing the information of the threshold voltage deviation ΔVth of the third transistor 264 in a memory. In this case, the electroluminescence display device 100 can continuously use the previously stored threshold voltage deviation ΔVth information. Therefore, if the stored threshold voltage deviation ΔVth information is utilized, it is advantageous that the first sensing step Sensing1 can be omitted. Accordingly, it is possible to reduce the time required for the first sensing step, and it is possible to drive with a faster refresh rate.

In some embodiments, the driving unit 130 may compensate the video signal by calculating the threshold voltage deviation ΔVth information of the third transistor 264 in real time. In this case, since the electroluminescence display device 100 can check the threshold voltage deviation ΔVth information in real time, there is an advantage that it can compensate in real time even if the threshold voltage deviation ΔVth characteristic changes in real time.

In some embodiments, the driving unit 130 may sense the threshold voltage deviation ΔVth information of the third transistor 264 at certain intervals and update it in the memory. For example, the driving unit 130 may sense the threshold voltage deviation ΔVth information of the third transistor 264 every month, every year, or every turn-off session of the product, so as to update information in the memory. In this case, the electroluminescence display device 100 can improve the accuracy of the stored threshold voltage deviation ΔVth and does not perform sensing operation in a normal operation, so that it is advantageous that both fast operation and real-time compensation can be achieved.

Figure 6:
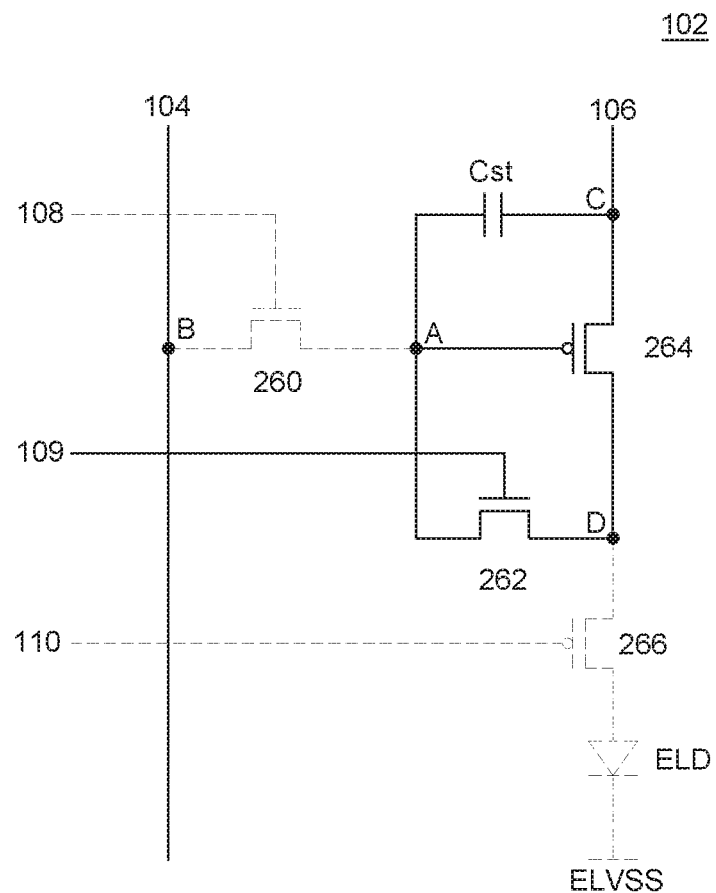
FIG. 6 is a circuit diagram illustrating the third step of the operation of the electroluminescence display device according to an embodiment of the present disclosure.

FIG. 6 is a circuit diagram illustrating the third step of the operation of the electroluminescence display device according to an embodiment of the present disclosure.

Hereinafter, the initialization step Initialization which is the third step will be described with reference to FIGS. 3 and 6.

In the third initialization step, the first scan signal Scan1 of the turn-off voltage L is supplied through the first scan line 108 to turn-off the first transistor 260, the second scan signal Scan2 of the turn-on voltage H is supplied through the second scan line 109 to turn-on the second transistor 262 and the EM signal EM of the turn-off voltage H is supplied through the EM line 110 to turn-off the fourth transistor 266.

The driving unit 130 applies the initialization voltage Vinit to the data line 104. The initialization voltage Vinit may be, for example, 0 V or a voltage less than zero.

In other words, if the data line 104 is not initialized, it may be difficult to sense the threshold voltage of the first transistor 260. That is, an accurate sensing may not be possible if the second voltage $\alpha'V$ remains in the data line (104) when the threshold voltage of the first transistor 260 is sensed. Accordingly, the driving unit 130 charges the second voltage $\alpha'V$ to the Node-A, then turns off the first transistor 260 and then initializes the Node-B.

According to the above described configuration, the first transistor 260 is turned-off, the second voltage $\alpha'V$ is charged in the Node-A and the data line 104 is initialized, thereby it is ready to sense the threshold voltage of the first transistor 260.

Figure 7:
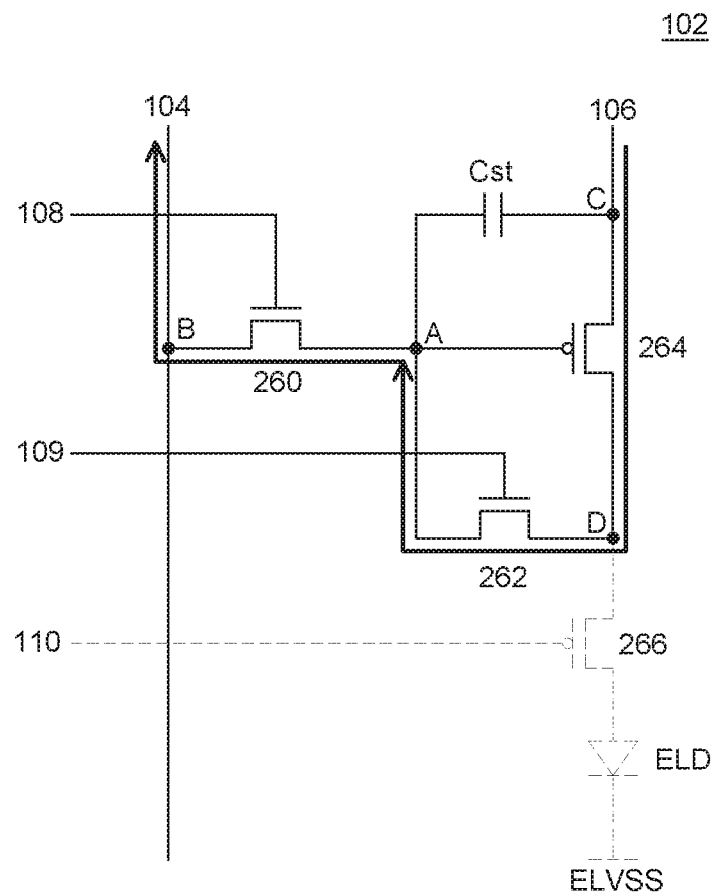
FIG. 7 is a circuit diagram illustrating the fourth step of the operation of the electroluminescence display device according to an embodiment of the present disclosure.

FIG. 7 is a circuit diagram illustrating the fourth step of the operation of the electroluminescence display device according to an embodiment of the present disclosure.

Hereinafter, the second sensing step Sensing2 which is the fourth step will be described with reference to FIGS. 3 and 7.

In the second sensing step Sensing2, which is the fourth step, the second scan signal Scan2 of the turn-on voltage H is supplied through the second scan line 109 to turn-on the second transistor 262, and the EM signal EM of the turn-off voltage H is supplied through the EM line 110 to turn-on the fourth transistor 266.

The driving unit 130 applies the sensing voltage S (i.e., SV) to the gate electrode of the first transistor 260 and senses the third voltage $\gamma V$ value of the Node-B connected to the data line 104 by the analog to digital converter, and analyzes the threshold voltage of the first transistor 260.

Specifically, the threshold voltage of the first transistor 260 is charged to a value obtained by subtracting the third voltage $\gamma V$ from the sensing voltage S. At this time, the third voltage $\gamma V$ charged to the Node-B may be charged up to a voltage smaller than or equal to the second voltage $\alpha'V$ of the Node-A. In other words, since the third voltage $\gamma V$ of the Node-B connected to the data line 104 is based on the second voltage $\alpha'V$ charged in the Node-A, the third voltage $\gamma V$ is charged up to equal to or smaller than the second voltage $\alpha'V$.

That is, the threshold voltage Vth=SV−$\gamma V$, wherein $\gamma V \leq \alpha'V$. Here, the threshold voltage Vth of the first transistor 260 may be different for each of the first transistors 260 of the sub-pixels 102. Then, Vsen=SV−$\gamma V$. Here, the sensed threshold voltage (i.e., Vsen) of the first transistor 260 means a value calculated by the driving unit 130.

Hereinafter, the second voltage $\alpha'V$ is assumed to be 8V, and the threshold voltage Vth of the first transistor 260 is assumed to be 2V. According to the above-described condition, the third voltage $\gamma V$ of the Node-B is not charged over 8V. Then, the driving unit 130 is configured to gradually change the sensing voltage S, so as to sense the threshold voltage of the first transistor 260.

For clarity, it should be noted that the threshold voltage of the first transistor 260 assumed above is an inherent characteristic with respect to the threshold voltage of a transistor, and the calculated threshold voltage Vsen by the driving unit 130, which will be described later, are substantially different values.

For example, when the sensing voltage S applied to the gate electrode of the first transistor 260 is set to 4 V, the third voltage $\gamma V$ of the Node-B is charged according to an equation of Vth=2V=4V−$\gamma V$, wherein ($\gamma V$<8). Accordingly, the third voltage $\gamma V$ becomes 2V. Then, the driving unit 130 determines Vsen=2V through calculation of Vsen=4V−2V. Accordingly, the driving unit 130 can sense the threshold voltage Vsen of the first transistor 260 as 2V.

For example, when the sensing voltage S applied to the gate electrode of the first transistor 260 is set to 6V, then, according to the equation, Vth=2V=6V−$\gamma V$, wherein ($\gamma V$<8), the third voltage $\gamma V$ of the Node-B is charged. Therefore, the third voltage $\gamma V$ becomes 4V. Then, the driving unit 130 determines Vsen=2V through calculation of Vsen=6V−4V. Accordingly, the driving unit 130 can sense the threshold voltage Vsen of the first transistor 260 as 2V.

For example, when the sensing voltage S applied to the gate electrode of the first transistor 260 is set to 8V, then, according to the equation, Vth=2V=8V−$\gamma V$, wherein ($\gamma V$<8), the third voltage $\gamma V$ of the Node-B is charged. Therefore, the third voltage $\gamma V$ becomes 6V. Then, the driving unit 130 determines Vsen=2V through calculation of Vsen=8V−6V. Accordingly, the driving unit 130 can sense the threshold voltage Vsen of the first transistor 260 as 2V.

For example, when the sensing voltage S applied to the gate electrode of the first transistor 260 is set to 10V, then, according to the equation, Vth=2V=10V−$\gamma V$, wherein ($\gamma V$<8), the third voltage $\gamma V$ of the Node-B is charged. Therefore, the third voltage $\gamma V$ becomes 8V. Then, the driving unit 130 determines Vsen=2V through calculation of Vsen=10V−8V. Accordingly, the driving unit 130 can sense the threshold voltage Vsen of the first transistor 260 as 2V.

Here, the sensing voltage S is configured to be smaller than a value obtained by subtracting the threshold voltage of the first transistor 260 from the second voltage $\alpha'V$ of the Node-A.

That is, the driving unit 130 sets the sensing voltage S to satisfy the condition, S<$\alpha'V$+Vth. If the above conditions are not satisfied, an error may occur in the threshold voltage sensing.

For example, when the sensing voltage S applied to the gate electrode of the first transistor 260 is set to 12V, then, according to the equation, Vth=2V=12V−$\gamma V$, wherein ($\gamma V$<8), the third voltage $\gamma V$ of the Node-B is charged. However, the third voltage $\gamma V$ should become 10V but the third voltage $\gamma V$ cannot increase to over 8V and, thus, the third voltage $\gamma V$ becomes 8V. Then, the driving unit 130 determines Vsen=4V through calculation of Vsen=12V−8V as an error. A problem arises that the driver 130 misjudges the threshold voltage Vth of the first transistor 260 in the above case. In order to solve such a problem, the driving unit 130 is configured to set the sensing voltage S based on the voltage of the Node-A and the threshold voltage of the first transistor 260.

Hereinafter, it is assumed that the second voltage $\alpha'V$ is assumed to be 8V and the threshold voltage Vth of the first transistor 260 is −1V. According to the above-described configuration, the third voltage $\gamma V$ of the Node-B is not charged to more than 8V.

For example, when the sensing voltage S applied to the gate electrode of the first transistor 260 is set to 6V, then, according to the equation, Vth=−1V=6V−γV, wherein (γV<8), the third voltage γV of the Node-B is charged. Therefore, the third voltage γV becomes 7V. Then, the driving unit 130 determines Vsen=−1V through calculation of Vsen=7V−8V. Accordingly, the driving unit 130 can sense the threshold voltage Vsen of the first transistor 260 as −1V.

For example, when the sensing voltage S applied to the gate electrode of the first transistor 260 is set to 8V, then, according to the equation, Vth=−1V=8V−γV, wherein (γV<8), the third voltage γV of the Node-B is charged. However, the third voltage γV should become 9V but the third voltage γV cannot be increased over 8V, thus, the third voltage γV becomes 8V. Then, the driving unit 130 determines Vsen=0V through calculation of Vsen=8V−8V as an error. A problem arises that the driver 130 misjudges the threshold voltage Vth of the first transistor 260 in the above case.

According to the above described configuration, the driving unit 130 may sense the threshold voltage Vth of the first transistor 260 by sensing the third voltage γV of the Node-B through the data line 104.

In particular, the electroluminescent display device 100 according to an embodiment of the present disclosure has an advantage that a threshold voltage of each of the P-type driving transistor and the N-type switching transistor can be sensed and compensated.

Particularly, it is advantageous that the electroluminescence display device 100 according to an embodiment of the present disclosure can compensate the threshold voltage deviation ΔVth of the driving transistor based on the second voltage information of the Node-A and the ELVDD voltage information of the sub-pixel 102. Further, the electroluminescence display device 100 according to an embodiment of the present disclosure can compensate the threshold voltage deviation ΔVth of the switching transistor with the second voltage information stored in the Node-A and by adjusting the sensing voltage S applied to the gate electrode of the switching transistor.

The driving unit 130 is configured to sense the second voltage α'V charged in the Node-A and sense the threshold voltage of the first transistor 260.

That is, the driving unit 130 is configured to sense the voltage of one data line 104 to determine the threshold voltage of the third transistor 264, and then senses the voltage of the same data line 104 again, to determine the threshold voltage of the first transistor 260.

To perform the above described operation, after the determination of the threshold voltage of the third transistor 264, the driving unit 130 may be configured to initialize the data line 104 to determine the threshold voltage of the first transistor 260.

In other words, the electroluminescence display device 100 according to an embodiment of the present disclosure is configured to sequentially sense the voltages from the data line 104, thereby sequentially senses the threshold voltage of the third transistor 264 and the threshold voltage of the first transistor 260.

Figure 8:
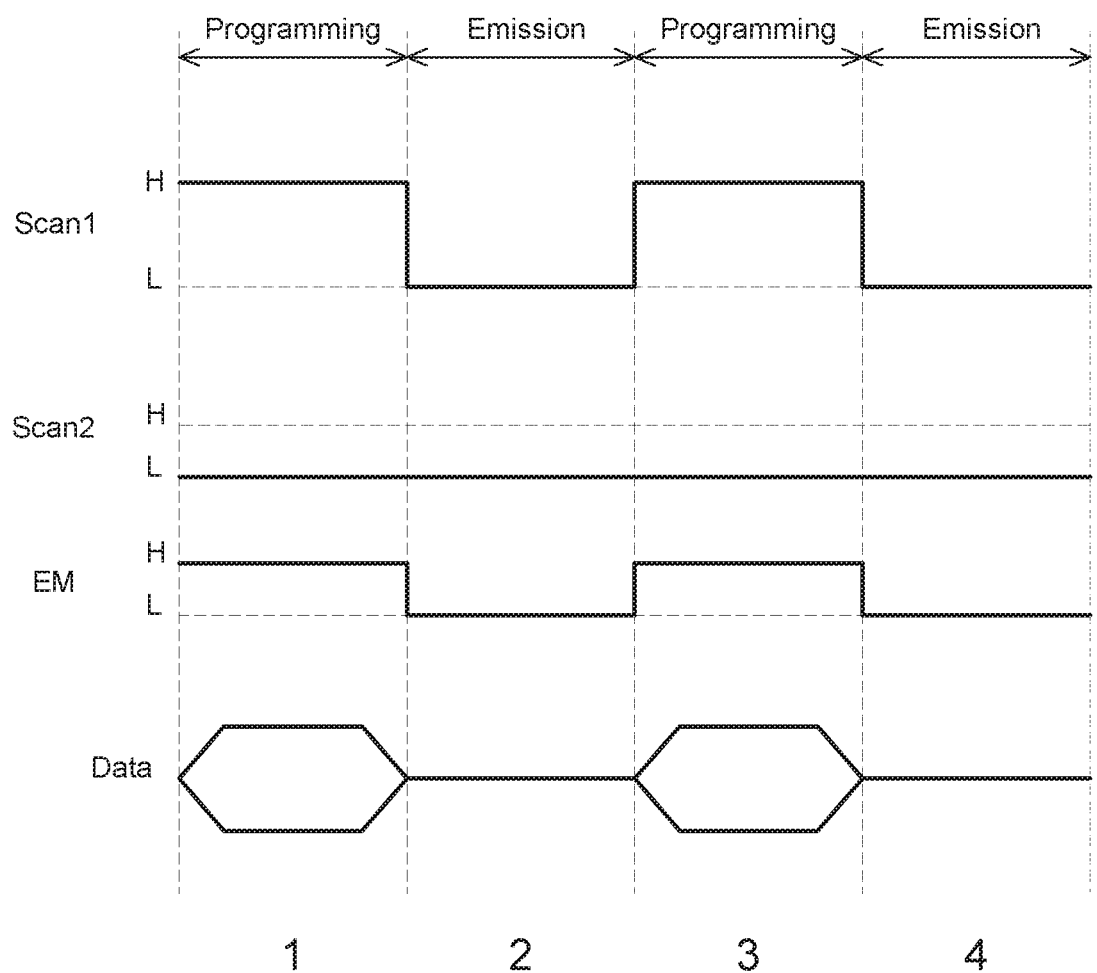
FIG. 8 is a waveform schematically illustrating the operation of the electroluminescence display device according to an embodiment of the present disclosure.

FIG. 8 is a waveform schematically illustrating the operation of the electroluminescence display device according to an embodiment of the present disclosure.

Referring to FIG. 8, a programming step and an emission step for displaying an image after threshold voltage sensing will be described.

The driving unit 130 of the electroluminescent display device 100 according to an embodiment of the present disclosure may be configured to store the threshold voltage of the first transistor 260 and the threshold voltage of the third transistor 264 by using the methods as described in FIG. 1 to FIG. 6.

In the programming step, the first scan signal Scan1 of the turn-on voltage H is supplied through the first scan line 108 to turn-on the first transistor 260, the second scan signal Scan2 of the turn-off voltage L is supplied through the second scan line 109 to turn-off the second transistor 262 and the EM signal EM of the turn-off voltage H is supplied through the EM line 110 to turn-off the fourth transistor 266.

In the emission step, the first scan signal Scan1 of the turn-off voltage L is supplied through the first scan line 108 to turn-off the first transistor 260, the second scan signal Scan2 of the turn-off voltage L is supplied through the second scan line 109 to turn-off the second transistor 262 and the EM signal EM of the turn-on voltage L is supplied through the EM line 110 to turn-on the fourth transistor 266.

That is, the driving unit 130 of the electroluminescence display device 100 according to an embodiment of the present disclosure may be configured to adjust the data voltage corresponding to the image signal according to the threshold voltage deviation ΔVth of the third transistor 264 of each sub-pixel 102. Therefore, the luminance uniformity of the display image can be improved and the quality of the image can be improved. Further, since the threshold voltage information of the third transistor 264 is stored in the memory, additional threshold voltage sensing may be unnecessary.

That is, when displaying an image on the plurality of sub-pixels 102, based on the threshold voltage of the first transistor 260 and the threshold voltage of the third transistor 264 stored in the driving units 130, the deviation can be compensated, and the image can be displayed with the programming step and the emission step only.

According to the above-described operation, since the electroluminescence display device 100 stores all the information required for compensation in the driving unit 130, it may be an advantage that it is possible to substantially omit the additional operation for compensating the threshold voltages of the first transistor 260 and the third transistor 264. Accordingly, it is possible to reduce the time required for threshold voltage sensing in displaying an image, and it is advantageous that it can be driven at a refresh rate of 240 Hz or more.

The driving unit 130 of the electroluminescence display device 100 according to an embodiment of the present disclosure is configured to determine the turn-on voltage H and the turn-off voltage L of the first scan signal SCAN1 based on the threshold voltage distribution characteristics of the first transistor 260 of the plurality of sub-pixels 102 of the pixel area AA. That is, when the turn-on voltage H and the turn-off voltage L of the first scan signal SCAN1 are determined within the threshold voltage distribution range, the specific first transistor 260 in the pixel region AA may malfunction.

However, the driving unit 130 of the electroluminescence display device 100 according to an embodiment of the present disclosure is configured to store the information of the threshold voltage distribution characteristics, and thus, the turn-on voltage and the turn-off voltage of the first scan signal SCAN1 can be set based on the threshold voltage distribution, thereby it is an advantage to suppress a malfunction of the first transistor 260.

That is, the driving unit 130 may be configured to store the minimum value and the maximum value of the threshold voltage distribution of the first transistor 260. The turn-on voltage of the first scan signal Scan1 may be greater than the maximum value and the turn-off voltage may be less than the minimum value.

In some embodiments, the first transistor 260 and the second transistor 262 may both be N-type switching transistors, and the turn-on voltage and the turn-off voltage of each of the scan signals supplied thereto may be set to be the same. That is, the turn-on voltage and the turn-off voltage of the second scan signal Scan2 may be determined based on the threshold voltage distribution characteristics of the first transistors 260. In addition, since the electroluminescence display device according to the embodiments of the present disclosure is manufactured by the semiconductor manufacturing method, the threshold voltage distribution characteristics of the first transistor 260 and the second transistor 262 may be substantially the same.

Accordingly, by analyzing the threshold voltage distribution characteristics of the first transistor 260, there is an advantage that the threshold voltage distribution characteristics of the second transistor 262 can be compensated as well.

In some embodiments, the first transistor 260 and the fourth transistor 266 may both be N-type switching transistors, and the turn-on voltage and the turn-off voltage of each of the supplied scan signals may be set to be the same. Therefore, by analyzing the threshold voltage distribution characteristics of the first transistor 260, there is an advantage that the threshold voltage distribution characteristics of the fourth transistor 262 can be compensated as well.

In some embodiments, all of the first transistor 260, the second transistor 262 and the fourth transistor 266 may be N-type switching transistors, and respective turn-on/off voltages may be set to be the same. Accordingly, by analyzing the threshold voltage distribution characteristics of the first transistor 260, it is possible to compensate for the threshold voltage distribution characteristics of the transistors of the same type.

In some embodiments, the second transistor 262 and/or the fourth transistor 266 may be a P-type transistor, wherein the driving unit is configured to store the minimum value and the maximum value of the threshold voltage distribution of the third transistor 264, wherein the turn-on voltage of the corresponding scan signal is configured to be smaller than the minimum value and the turn-off voltage of the corresponding scan signal is configured to be greater than the maximum value. That is, the driving unit may be configured to determine a turn-on voltage and a turn-off voltage of the applied scan signal depending on whether the switching transistor is an N-type or a P-type transistor. According to the above-described configuration, it is advantageous that since the first transistor 260 is an N-type transistor and the threshold voltage distribution characteristics of the first transistor 260 is analyzed, the threshold voltage of another N-type transistor can be compensated, and the third transistor 264 is a p-type transistor and the threshold voltage distribution characteristics of the third transistor 264 is analyzed, the threshold voltage of another p-type transistor can be compensated.

In some embodiments, at a predetermined period, the driving unit of the electroluminescence display device may be configured to update the threshold voltage of the N-type switching transistor and the threshold voltage information of the P-type driving transistor. In this case, there is an advantage that the long term reliability, in which may be gradually degraded, can be compensated by compensating the threshold voltage according to the predetermined period. In addition, according to the above-described configuration, there is an advantage that high-speed driving can be performed except for the sensing time which is driven at a specific cycle. The specific period may be, for example, one month, one year, and may be set directly by a user or engineer to execute the sensing mode.

In some embodiments, the driving unit of the electroluminescence display device may operate according to a specific emission duty ratio on the EM signal during the emission step. For example, it can be driven by a pulse width modulation (PWM) method.

The exemplary embodiments of the present disclosure can also be described as follows.

According to an embodiment of the present disclosure, there is provided an electroluminescence display device comprising a plurality of sub-pixels, and each sub-pixel may include a Node-A electrically connected to an electrode of a storage capacitor and a gate electrode of a P-type driving transistor, an N-type switching transistor configured to switch an electrical connection between a Node-B electrically connected to a data line and the Node-A, a Node-C configured to supply ELVDD voltage and electrically connected to another electrode of the storage capacitor and a first electrode of the P-type driving transistor, a Node-D configured to supply current to an electroluminescence diode and electrically connected to a second electrode of the P-type driving transistor and a first transistor configured to switch an electrical connection between the Node-A and the Node-D, wherein each of the plurality of sub-pixels is configured to compensated a first threshold voltage deviation of the P-type driving transistor and a second threshold voltage deviation of the N-type switching transistor based on a voltage at the Node-A.

The electroluminescence display device may further include a driving unit electrically connected to the data line and configured to store a first threshold voltage of the P-type driving transistor and a second threshold voltage of the N-type switching transistor.

The driving unit may be configured to selectively supply an image signal to the data line or sense a voltage of the date line.

The driving unit may be configured to sequentially sense the first threshold voltage and the second threshold voltage by sequentially sensing the voltage of the data line.

The driving unit may be configured to adjust a voltage of the image signal corresponding to the first threshold voltage deviation of each of the plurality of sub-pixels.

The driving unit may be configured to sense the second threshold voltage by sensing a voltage charged in the Node-A.

The driving unit may be configured to sense the voltage at the data line to determine the first threshold voltage and then sense the voltage of the data line again to determine the second threshold voltage.

The driving unit may be configured to initialize the data line for sensing the second threshold voltage after the determination of the first threshold voltage.

When the plurality of sub-pixels displays an image, the electroluminescence display device may be configured to display the image with a programming step and an emission step only by compensating the first threshold voltage deviation and the second threshold voltage deviation based on information of the first threshold voltage and the second threshold voltage stored in the driving unit.

When the plurality of sub-pixels displays an image, the driving unit may be configured to update information of the first threshold voltage and the second threshold voltage at a certain period.

The electroluminescence display device may further include a first scan line electrically connected to a gate electrode of the N-type switching transistor, a second scan line electrically connected to a gate electrode of the first transistor, and a scan driver configured to supply a first scan signal and a second scan signal to the first scan line and the second scan line.

A turn-on voltage and a turn-off voltage of the first scan signal may be determined based on a second threshold voltage distribution of the N-type switching transistors of the plurality of sub-pixels.

The electroluminescence display device may further include a driving unit electrically connected to the data line and configured to store information of a first threshold voltage of the P-type driving transistor and a second threshold voltage of the N-type switching transistor, wherein the driving unit is configured to store the minimum value and the maximum value of the second threshold voltage distribution.

The turn-on voltage of the first scan signal may be configured to be greater than the maximum value of the second threshold voltage distribution, and wherein the turn-off voltage of the first scan signal is configured to be less than the minimum value of the second threshold voltage distribution.

The electroluminescence display device may further include a driving unit electrically connected to the data line and configured to store information of a first threshold voltage of the P-type driving transistor and a second threshold voltage of the N-type switching transistor, a second transistor configured to switch an electrical connection between the electroluminescence diode and the D Node- and an EM line electrically connected to a gate electrode of the second transistor and configured to transfer an EM signal from the scan driver, wherein the second transistor is configured to suppress leakage current generated from the Node-D to the electroluminescence diode when the driving unit senses the first threshold voltage and the second threshold voltage.

Each of the first transistor and the second transistor may be made of an N-type or P-type transistor.

The electroluminescence display device may further include a driving unit electrically connected to the data line and configured to store information of a first threshold voltage of the P-type driving transistor and a second threshold voltage of the N-type switching transistor, wherein the driving unit is configured to determine a turn-on voltage and a turn-off voltage of a scan signal to be applied according to whether the first transistor and the second transistor are N-type or P-type transistors.

If the first transistor is the N-type transistor, the turn-on voltage of the second scan signal may be configured to be greater than the maximum value of the second threshold voltage distribution, and the turn-off voltage of the second scan signal is configured to be smaller than the minimum value of the second threshold voltage distribution.

If the second transistor is the P-type transistor, the driving unit may be configured to store the minimum value and the maximum value of the first threshold voltage distribution, a turn-on voltage of an EM signal is configured to be greater than the maximum value of the first threshold voltage distribution, and a turn-off voltage of the EM signal is configured to be smaller than the minimum value of the first threshold voltage distribution.

The P-type driving transistor may be a crystallized silicon semiconductor transistor, and the N-type switching transistor may be an oxide semiconductor transistor.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purpose only but not intended to limit the technical concept of the present disclosure. The scope of the technical concept of the present disclosure is not limited thereto. Therefore, it should be understood that the above-described embodiments are illustrative in all aspects and not restrictive. The protective scope of the present disclosure should be construed based on the following claims, and all the technical concepts in the equivalent scope thereof should be construed as falling within the scope of the present disclosure.

What is claimed is:

1. An electroluminescence display device comprising:
    a plurality of sub-pixels, each of the plurality of sub-pixels including:
        a Node-A electrically connected to an electrode of a storage capacitor and a gate electrode of a P-type driving transistor;
        an N-type switching transistor configured to switch an electrical connection between a Node-B electrically connected to a data line and the Node-A;
        a Node-C configured to supply an ELVDD voltage and electrically connected to another electrode of the storage capacitor and a first electrode of the P-type driving transistor;
        a Node-D configured to supply current to an electroluminescence diode and electrically connected to a second electrode of the P-type driving transistor;
        a first transistor configured to switch an electrical connection between the Node-A and the Node-D; and
        a driving unit electrically connected to the data line and configured to store a first threshold voltage of the P-type driving transistor and a second threshold voltage of the N-type switching transistor,
    wherein each of the plurality of sub-pixels is configured to compensate the first threshold voltage deviation of the P-type driving transistor and the second threshold voltage deviation of the N-type switching transistor based on a voltage at the Node-A,
    wherein the driving unit is configured to selectively supply an image signal to the data line or sense a voltage of the data line,
    wherein the driving unit is configured to sequentially sense the first threshold voltage and the second threshold voltage by sequentially sensing the voltages of the Node-A and the Node-B through the data line, and
    wherein the N-type switching transistor is turned off between sensing of the first threshold voltage of the P-type driving transistor and sensing of the second threshold voltage of the N-type switching transistor.

2. The electroluminescence display device of claim 1, wherein the driving unit is configured to adjust a voltage of the image signal corresponding to the first threshold voltage deviation of each of the plurality of sub-pixels.

3. The electroluminescence display device of claim 1, wherein the driving unit is configured to sense the second threshold voltage by sensing a voltage charged in the Node-A.

4. The electroluminescence display device of claim 1, wherein the driving unit is configured to sense the voltage at the data line to determine the first threshold voltage and then sense the voltage of the data line again to determine the second threshold voltage.

5. The electroluminescence display device of claim 4, wherein the driving unit is configured to initialize the data line for sensing the second threshold voltage after the determination of the first threshold voltage.

6. The electroluminescence display device of claim 1, wherein when the plurality of the sub-pixels displays an image, the electroluminescence display device is configured to display the image with a programming step and an emission step only by compensating the first threshold voltage deviation and the second threshold voltage deviation based on information of the first threshold voltage and the second threshold voltage stored in the driving unit.

7. The electroluminescence display device of claim 1, wherein when the plurality of sub-pixels display an image, the driving unit is configured to update information of the first threshold voltage and the second threshold voltage at a certain period.

8. The electroluminescence display device of claim 1, further comprising:
a first scan line electrically connected to a gate electrode of the N-type switching transistor;
a second scan line electrically connected to a gate electrode of the first transistor; and
a scan driver configured to supply a first scan signal and a second scan signal to the first scan line and the second scan line.

9. The electroluminescence display device of claim 8, wherein a turn-on voltage and a turn-off voltage of the first scan signal are determined based on a second threshold voltage distribution of the N-type switching transistors of the plurality of sub-pixels.

10. The electroluminescence display device of claim 9, wherein the driving unit is configured to store the minimum value and the maximum value of the second threshold voltage distribution.

11. The electroluminescence display device of claim 10, wherein the turn-on voltage of the first scan signal is configured to be greater than the maximum value of the second threshold voltage distribution, and wherein the turn-off voltage of the first scan signal is configured to be less than the minimum value of the second threshold voltage distribution.

12. The electroluminescence display device of claim 8, further comprising:
a second transistor configured to switch an electrical connection between the electroluminescence diode and the D node; and
an EM line electrically connected to a gate electrode of the second transistor and configured to transfer an EM signal from the scan driver,
wherein the second transistor is configured to suppress leakage current generated from the Node-D to the electroluminescence diode when the driving unit senses the first threshold voltage and the second threshold voltage.

13. The electroluminescence display device of claim 12, wherein each of the first transistor and the second transistor is made of an N-type or P-type transistor.

14. The electroluminescence display device of claim 9, wherein the driving unit is configured to determine a turn-on voltage and a turn-off voltage of a scan signal to be applied according to whether the first transistor and the second transistor are N-type or P-type transistors.

15. The electroluminescence display device of claim 14, wherein if the first transistor is the N-type transistor, the turn-on voltage of the second scan signal is configured to be greater than the maximum value of the second threshold voltage distribution, and the turn-off voltage of the second scan signal is configured to be smaller than the minimum value of the second threshold voltage distribution.

16. The electroluminescence display device of claim 14, wherein if the second transistor is the P-type transistor, the driving unit is configured to store the minimum value and the maximum value of a first threshold voltage distribution, a turn-on voltage of an EM signal is configured to be greater than the maximum value of the first threshold voltage distribution, and a turn-off voltage of the EM signal is configured to be smaller than the minimum value of the first threshold voltage distribution.

17. The electroluminescence display device of claim 1, wherein the P-type driving transistor is a crystallized silicon semiconductor transistor, and the N-type switching transistor is an oxide semiconductor transistor.

* * * * *